United States Patent [19]

Lambert et al.

[11] 4,215,315
[45] Jul. 29, 1980

[54] LOW FREQUENCY SIGNAL PERIOD OR RATIO (PERIOD)-TO-VOLTAGE CONVERTER

[75] Inventors: Dennis L. Lambert, Bothell; Paul R. Lantz, Seattle, both of Wash.

[73] Assignee: John Fluke Mfg. Co., Inc., Mountlake Terrace, Wash.

[21] Appl. No.: 951,114

[22] Filed: Oct. 13, 1978

[51] Int. Cl.$^2$ .................... H03K 9/06; H03K 13/02; H03K 13/32
[52] U.S. Cl. ................... 328/140; 328/151; 324/78 E; 328/133
[58] Field of Search .................. 328/26, 140, 151; 324/78 E, 78 J

[56] References Cited

U.S. PATENT DOCUMENTS

| | | | |
|---|---|---|---|
| 3,541,320 | 11/1970 | Beall | 328/151 X |
| 3,839,673 | 10/1974 | Acker | 324/78 E |
| 4,068,181 | 1/1978 | Clark et al. | 328/133 |
| 4,134,029 | 1/1979 | Bright et al. | 328/151 X |

*Primary Examiner*—John S. Heyman
*Attorney, Agent, or Firm*—Christensen, O'Connor, Johnson & Kindness

[57] ABSTRACT

A converter that provides an analog (voltage) output signal that denotes either the period of an unknown low frequency signal or the ratio between the periods of two unknown low frequency signals is disclosed. The converter includes a ramp generator having a capacitor that is alternately charged in accordance with the periods of two low frequency signals. Between charging cycles the capacitor is discharged. When the period of an unknown low frequency signal is to be converted to analog form, one of the charge controlling signals is the unknown signal and the other signal is a known low frequency signal. When the ratio of the periods of two unknown low frequency signals is to be converted to analog form, the two unknown signals control the charging of the capacitor of the ramp generator. The ramp generator charge controlled by the period of the known signal (in the period conversion case) or one of the unknown signals (in the ratio conversion case) is used to control the level of a signal stored by a feedback sample and hold circuit, which circuit controls the output of the current source that charges the capacitor of the ramp generator. The ramp generator charge controlled by the other signal (the unknown in the period conversion case or the other unknown in the ratio conversion case) controls the level of an analog signal stored by an output sample and hold circuit, which signal represents: (a) the period of the unknown signal in the period conversion case; and, (b) the ratio between the periods of the unknown signals in the ratio conversion case.

18 Claims, 9 Drawing Figures

LOW FREQUENCY SIGNAL PERIOD OR RATIO (PERIOD)-TO-VOLTAGE CONVERTER

TECHNICAL AREA OF THE INVENTION

This invention is directed to apparatus for analyzing electronic signals and, more particularly, to apparatus for determining period information about low frequency electronic signals and presenting the determined information in analog form.

BACKGROUND OF THE INVENTION

A wide variety of apparatus suitable for generating an analog signal, e.g., a DC voltage, proportional to either the frequency or period of a signal of unknown frequency/period have been proposed. Many such apparatus charge a capacitor for a measurement interval determined by the period of the unknown signal and, thus, depend upon the fact that a capacitor charges in accordance with the mathematical expression $i = C\, dv/dt$. As long as the value of the capacitor (C) is known, and the current into the capacitor (i) and the change in voltage across the capacitor (dv) are calibrated (or known), the time change (dt) can be easily determined. Depending upon the linearity of such apparatus, dt is directly related to the period and inversely related to the frequency of the unknown signal.

Apparatus that utilize a capacitor charge technique to determine the period or frequency of an unknown signal (commonly called period or frequency converters) can be divided into two general groups. One group comprises circuits that continuously sample the unknown signal and produce an output that is a running average of the capacitor charge. One of the problems with these circuits is that they require heavy filtering of the continuous output (which contains a large AC voltage component as well as the desired DC voltage). Because of the heavy filtering required, these techniques tend to be useful only at frequencies above a few hundred Hz (periods below a few thousandths of a second). Below roughly 200 Hz, i.e., in the low frequency range, the settling time of the filter required becomes very slow (of the order of several seconds). As a result, for low frequency (long period) signals, these circuits are only useful if the frequency of the signal changes slowly. Examples of circuits utilizing this approach are described in U.S. Pat. No. 3,416,082 (Clerc), 3,040,983 (Bigelow), and 3,323,049 (Hanken).

The second group of circuits uses some form of sample and hold technique to store the output. These circuits convert the period of the unknown signal to a voltage (analog signal) one cycle at a time and update the sampled and held output at the end of each conversion cycle. Thus, the sampled and held signal is proportional to the period of the unknown signal. Because the passage of a single cycle is theoretically adequate to provide a valid output voltage, these circuits are useful at much lower frequencies than the first group of circuits discussed above. Examples of circuits that utilize a sample and hold technique are described in U.S. Pat. No. 3,535,658 (Webb) and 3,743,940 (Yamagata).

While the present invention falls in the latter group described above, i.e., the sample and hold group, it provides a substantially improved (in accuracy) output. Specifically, previously developed apparatus using the techniques described above are accurate to approximately plus or minus one percent (at best). This accuracy limitation occurs because both of these prior art techniques depend on the time and temperature stbility of a capacitor, a current source and various other circuitry. Because of the lack of capacitors and other circuit elements having extremely good time and temperature stability, plus good linearity, the plus or minus one percent in accuracy noted above occurs. More specifically, while capacitors can be made with low temperature coefficients, such capacitors tend to have poor dielectric properties. The poor dielectric properties result in such capacitors making nonlinear ramp generators, whereby electronic conversion circuits using such capacitors are inaccurate. Further, while resistors having very low drift can be made, ramp generators utilizing such resistors are highly nonlinear. While field effect transistors or other circuit elements can be added to such generators to linearize their outputs, such elements have a strong temperature dependence. In other words, linearity improvements are made at the cost of a reduction in temperature and time stability. In essence, this statement summarizes the foregoing discussion. That is, when components (capacitors, resistors, etc.) are chosen to improve linearity, prior art period and frequency converters become less time and temperature stable and vice versa. Yet there remains a demand for a precision low frequency period to voltage converter that is both linear and stable with respect to time and temperature. For example, a demand exists for such a converter in the measurement of the rotational period of rotating machinery. A demand also exists in the data logging field where much of the equipment is voltage oriented, i.e., the data logging equipment is adapted to receive information in analog (voltage) form.

Therefore, it is an object of this invention to provide a new and improved apparatus for determining the period of an unknown signal.

It is a further object of this invention to provide a period-to-voltage converter.

It is yet another object of this invention to provide a period-to-voltage converter that is both linear and stable, with respect to both time and temperature.

While various devices have been proposed for determining the ratio of the periods (or frequencies) of a pair of unknown signals, for various reasons, these proposals have been unsatisfactory. Many of them use period-to-voltage converters of the types discussed above and, thus, have the disadvantages discussed above. In addition, most prior art ratio-to-voltage converters include independent channels for converting each signal separately. In addition to increasing the inaccuracy of the result because the time and temperature stability of the channels usually fluctuate differently, the inclusion of two converting channels makes the systems more complex than desirable.

Therefore, it is a further object of this invention to provide a new and improved apparatus for determining the ratio of the periods of a pair of unknown signals.

It is another object of this invention to provide a new and improved ratio (period)-to-voltage converter.

It is yet another object of this invention to provide a ratio (period)-to-voltage converter that is both linear and stable, with respect to both time and temperature.

It is a composite object of this invention to provide a single apparatus that can be used to determine either the period of an unknown signal or the ratio between the periods of a pair of unknown signals.

SUMMARY OF THE INVENTION

In accordance with this invention, a converter for converting electronic signal period information into analog (voltage) form is provided. The converter can be used to convert information about the period of an unknown frequency signal, or information about the ratio of the periods of two unknown frequency signals, into analog form. The converter includes a ramp generator having a capacitor that is sequentially charged and discharged. The charging time is alternately controlled by the periods of first and second signals. The ramp generator capacitor charge controlled by the period of the first signal controls a feedback signal that, in turn, controls the rate of charging of the capacitor. The ramp generator capacitor charge controlled by the period of the second signal controls the magnitude of the analog (voltage) output of the converter. When the period of an unknown frequency signal is to be determined, the first signal is produced by a signal generator and, thus, has a known period. The unknown frequency signal forms the second signal. When the ratio of the periods of two unknown frequency signals is to be determined, one of the unknown signals forms the first signal and the second forms the second signal.

In the preferred form of the invention, the capacitor of the ramp generator is charged from a current source through a first switch that is alternately closed for time periods determined by the period of the first and second signals. The charge on the capacitor controlled by the period of the first signal is used to control a negative feedback circuit whose output controls the magnitude of the current produced by the current source. The charge on the capacitor controlled by the second signal controls the level of the signals stored by an output sample and hold circuit. A second switch, connected to ground the capacitor of the ramp generator, is closed prior to the periods of time that the first switch is closed, i.e., when the first switch is open.

In accordance with further aspects of this invention, preferably, the feedback circuit comprises a feedback sample and hold circuit that includes a capacitor. The capacitor of the ramp generator, at the end of the charge cycle controlled by the first signal, is connected by a third switch to the feedback sample and hold circuit. The connection is such that the ramp generator capacitor charge controls the charge on the capacitor of feedback sample and hold circuit, which in turn controls the level of the control signal applied to the current source by the feedback sample and hold circuit. The output sample and hold circuit also includes a capacitor. At the end of the charge cycle controlled by the second signal, the ramp generator capacitor is connected by a fourth switch to the capacitor of the output sample and hold circuit such that the charge on the capacitor of the output sample and hold circuit is controlled by the charge level of the capacitor of the ramp generator.

In accordance with further principles of this invention, timing and control logic determine the period of the first and second signals. In accordance therewith, the timing and control logic control the opening and closing of the switches that control the discharging of the capacitor of the ramp generator; the charging of the capacitor of the ramp generator; and, the connection of the output of the ramp generator to the feedback sample and hold circuit and to the output sample and hold circuit.

As will be readily appreciated from the foregoing discussion, the invention provides an apparatus for converting period information into voltage information. The period information can be the period of an unknown frequency signal, of the ratio between the periods of two unknown frequency signals. Regardless of the type of information to be converted, the apparatus of the invention is extremely precise. Errors due to time and temperature variations are virtually eliminated by the use of a feedback control circuit. More specifically, if the characteristics of various common circuit components, such as the capacitor of the ramp generator, change over a period of time, the negative feedback control signal changes in a compensating manner. Since the feedback control signal changes in a compensating manner, the magnitude of current produced by the current source (which charges the capacitor of the ramp generator), changes in a compensating manner. In addition, the apparatus of the invention is substantially less complicated than prior ratio determining systems that use independent channels to produce voltage signals and determine the ratio of the periods by comparing the ratio of the voltage signals. Further, the invention can be easily calibrated by applying only the known frequency signal and calibrating the feedback circuit so that a full scale output is obtained.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Figure 1:
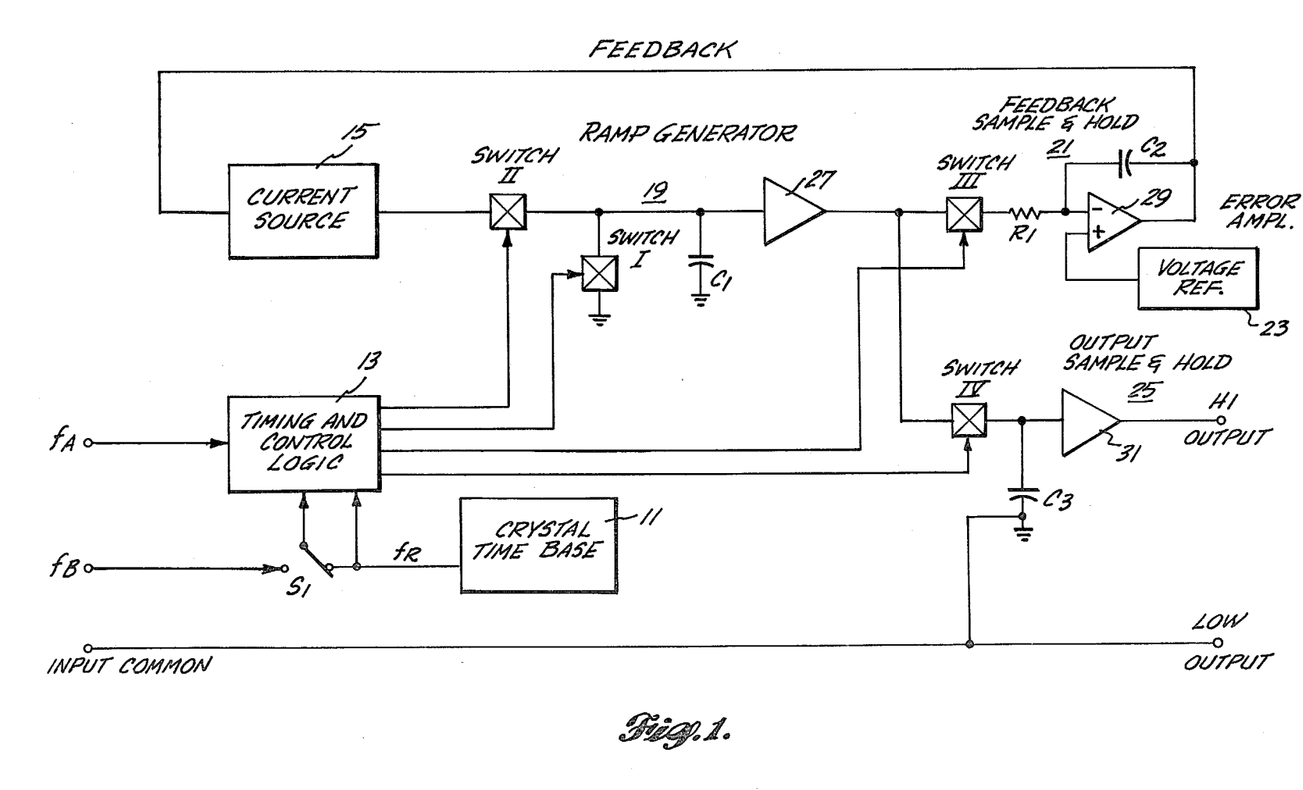
FIG. 1 is a partially block and partially schematic diagram of a preferred embodiment of a low frequency signal period or ratio (period)-to-voltage converter formed in accordance with the invention.
Figure 4:
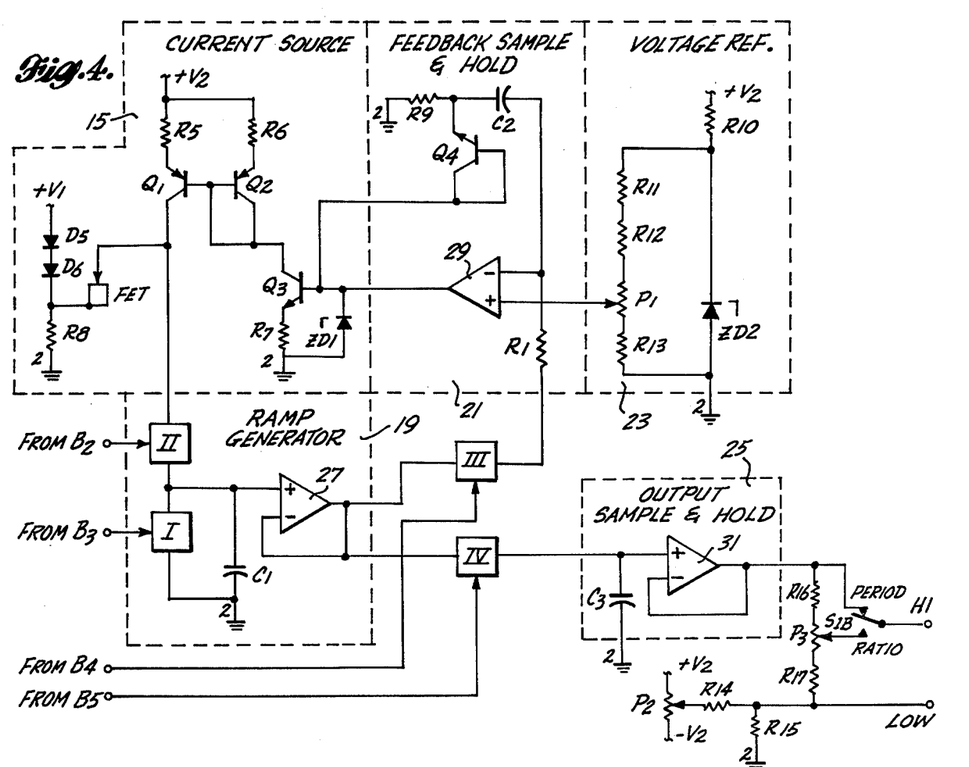
FIG. 4 is a schematic diagram of a current source, ramp generator, feedback sample and hold circuit, voltage reference and output sample and hold circuit suitable for use in the embodiment of the invention illustrated in FIG. 1.

FIG. 1 is a partially block and partially schematic diagram of a preferred embodiment of a converter formed in accordance with the invention and comprises: a crystal time base 11; timing and control logic 13; a current source 15; a ramp generator 19; a feedback sample and hold circuit 21; a voltage reference 23; and, an output sample and hold circuit 25. The ramp generator comprises: a first switch denoted switch I; a second switch denoted switch II; a capacitor designated C1; and, a unity amplifier 27. The feedback sample and hold circuit 21 comprises a resistor designated R1; a capacitor designated C2; and, an error amplifier 29. The error amplifier is illustrated as an operational amplifier (OP AMP) having inverting and noninverting inputs. The output sample and hold circuit 25 comprises: a capacitor designated C3; and, a unity amplifier 31. Preferably the unity amplifiers 27 and 31 of the ramp generator 19 and the output sample and hold circuit 25 are also OP AMPs as shown in FIG. 4 and hereinafter described. In addition to the foregoing items, the embodiment of the invention illustrated in FIG. 1 also includes a third switch designated switch III and a fourth switch designated switch IV. Switches I, II, III and IV are all bilateral switches, preferably semiconductor bilateral switches. (Field effect transistors can also be used.) Finally, the embodiment of the invention illustrated in FIG. 1 includes a manually operable single pole double throw switch designated S1.

The crystal time base 11 produces a reference signal $f_R$, which may have a frequency of 75 Hz (a period of 13.3 ms), for example. $f_R$ is applied to the timing and logic control 13 and to one of the remote terminals of S1. The common terminal of S1 is connected to the timing and control logic 13. The timing and control logic is also connected to a first terminal adapted to receive a first unknown frequency signal designated $f_A$. The other remote terminal of S1 is connected to a second terminal adapted to receive a second unknown frequency signal designated $f_B$. Thus, either $f_R$ or $f_B$ can be applied to the timing and control logic via S1. The timing and control logic 13 produces control signals that are applied to the control inputs of switches I, II, III and IV.

The output of the current source 15 is applied through switch II to the input of the unity amplifier 27 of the ramp generator 19. The input of the unity amplifier 27 of the ramp generator 19 is also connected through switch I to ground. C1 is connected between ground and the input of the unity amplifier 27 of the ramp generator 19. The output of the ramp generator 19 is applied through switch III to one end of R1. The other end of R1 is connected to the inverting input of the error amplifier 29 of the feedback sample and hold circuit 21. The noninverting input of the error amplifier of the feedback sample and hold circuit 21 is connected to the output of the voltage reference 23. C2 is connected between the output of the error amplifier 29 and the inverting input of the error amplifier. Further, the output of the error amplifier 29 is connected to the control input of the current source 15. The values of R1, C2 and the time during which switch III is closed determine the stability of the feedback loops formed by switch III and the feedback sample and hold circuit 21.

The output of the unity amplifier 27 of the ramp generator 19 is also applied through switch IV to the input of the unity amplifier 31 of the output sample and hold circuit 25. C3 is connected between the input of the unity amplifier 31 of the output sample and hold and circuit 31 and ground. The output of the unity amplifier 31 of the output sample and hold circuit 25 is denoted the high (HI) output and a ground bus is denoted the low (LOW) output.

Turning now to a description of the operation of the embodiment of the invention illustrated in FIG. 1 when the period of an unknown frequency signal ($f_A$) is to be determined; in this mode of operation S1 is set such that $f_R$ is applied to the timing and control logic 13 through S1 (as well as directly). Thereafter, the converter alternates between calibration and measurement cycles. Each such cycle includes a discharge subcycle followed by a charge subcycle.

Figure 5:
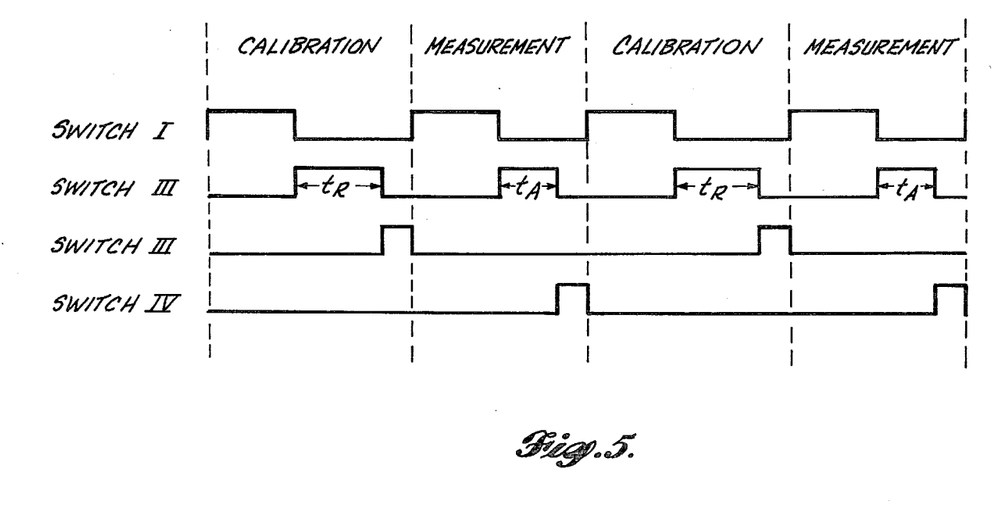
FIG. 5 is a switching diagram illustrating the sequence of operation of the switches illustrated in FIGS. 1 and 4 for a period conversion sequence of operation.

Turning first to the calibration cycle, first C1 is discharged (discharge cycle). As illustrated in FIG. 5, this is accomplished by the timing and control logic closing switch I. At this time, switches II, III and IV are open. Next, the timing and control logic 13 opens switch I and closes switch II, switches III and IV remaining open. Switch II is closed for a single period of $f_R$. As a result, C1 is charged for a time ($t_R$) equal to the period of $f_R$. At the end of the $f_R$ period, switch II is opened and switch III is closed (switches I and IV remaining open), whereby the voltage on C1 is used to charge, or update the charge on, C2. More specifically, the feedback sample and hold circuit, when switch III is closed, samples the charge on C1 and changes (if necessary) the charge on C2 accordingly. Since, as noted above, the output of the error amplifier 29 is connected to the control input of the current source 15 and since the charge on C2, in essence, controls the output of the error amplifier, the charge on C2 controls the magnitude of the current produced by the current source 15. It is this arrangement that makes the converter very temperature and time stable. More specifically, if the impedance value of the components forming the current generator, the ramp generator or the feedback sample and hold circuit change due to temperature and/or time, the value of the negative feedback voltage is automatically adjusted to compensate for such changes. Thus, for example, the effect of a change in the capacitive value of C1 is reduced by the gain of the feedback loop. As a result, it is possible to choose a highly linear capacitor having a low dielectric absorption, even though such a capacitor has a high temperature coefficient of capacitance, without loss of accuracy.

After the calibration cycle is complete, switch III is opened, and switch I is again closed, switches II and IV remaining open. As a result, C1 is again discharged. Next, switch I is opened and switch II is closed (switches III and IV remaining open) for a single period of $f_A$. As a result, C1 is charged to a value proportional to the period ($t_A$) of $f_A$. Next, switch II is opened, and switch IV is closed, switches I and III remaining open. When switch IV is closed, the voltage on C1 is used to charge, or update the charge on, C3 by either adding charge to or drawing charge away from C3, depending upon whether the charge on C1 is above or below the charge on C3. Thereafter, switch IV is opened and the calibration cycle is repeated, followed by another measurement cycle, as illustrated in FIG. 5. Thus, calibration and measurement cycles alternately occur.

By choosing (or adjusting) the value of the components forming the current source, ramp generator and feedback sample and hold circuit appropriately, the voltage output of the output sample and hold circuit can be calibrated to be directly related to the period of $f_A$. For example, if the period of $f_R$ is 13.3 ms, a divide-by-three divider in the timing and control circuit 13 can create a 40 ms reference. In such a case, these subsystems could be adjusted such that C1 is charged to 40 mv during a single $f_R$ period. As a result, the output of the output sample and hold circuit, in mv, would be directly related to $f_A$. (In practice, it is easier to let the output be 100 times the period in milliseconds, i.e., a 40.0 ms period equals 4.0 volts out.) In essence the output voltage is ratio related to the period of signals controlling the charges on C1. If the charge for the period ($t_R$) of $f_R$ is denoted $v_R$ and the charge for the period ($t_A$) of $f_A$ is denoted $v_A$, clearly $t_R$: $v_R$ and $t_A$: $v_A$. Assuming that the proportionality constant in both cases is one (1): $t_A/t_R = v_A/v_R$. Or, $v_A = (t_A/t_R)v_R$. It is because of this relationship that the converter can determine the ratio between the periods of two unknown frequency signals, as well as the period of a single unknown frequency signal.

Turning now to the ratio conversion mode of operation, the same sequence of opening and closing of switches I, II, III and IV occurs; however, the charge on C1 controlled by $f_R$ during the period conversion sequence is now controlled by $f_B$. More specifically, during a ratio sequence, S1 is positioned so as to apply $f_B$ to the timing and control logic 13, rather than $f_R$. ($f_r$ still remains directly applied for reasons that will be understood from the following discussion of FIG. 2.) As a result, $f_B$ controls the feedback voltage, which controls the magnitude of current produced by the current source 15. Since the current source, ramp generator and feedback sample and hold circuit form a feedback control loop, the precise period of $f_B$ does not need to be known to equate the output voltage to the ratio $t_A/t_B$. Rather C3 will be automatically charged to a value such that the output voltage $v_A$ will be the ratio $t_A/t_B$. This result will be readily seen from the foregoing equations. More specifically, in the foregoing equations, $t_R$ can be replaced by $t_B$ and $v_R$ replaced by $v_B$ whereby $v_A = (t_A/t_B)v_B$. Ignoring settling time, regardless of the value of $t_B$, $v_B$ will always charge to the same value. Specifically due to the negative feedback, if $t_B$ increases in time, the magnitude of current produced by the current source will decrease and vice versa. Since $v_B$ is a constant, it can be set equal to one, whereby $v_A = t_A/t_B$.

Figure 2:
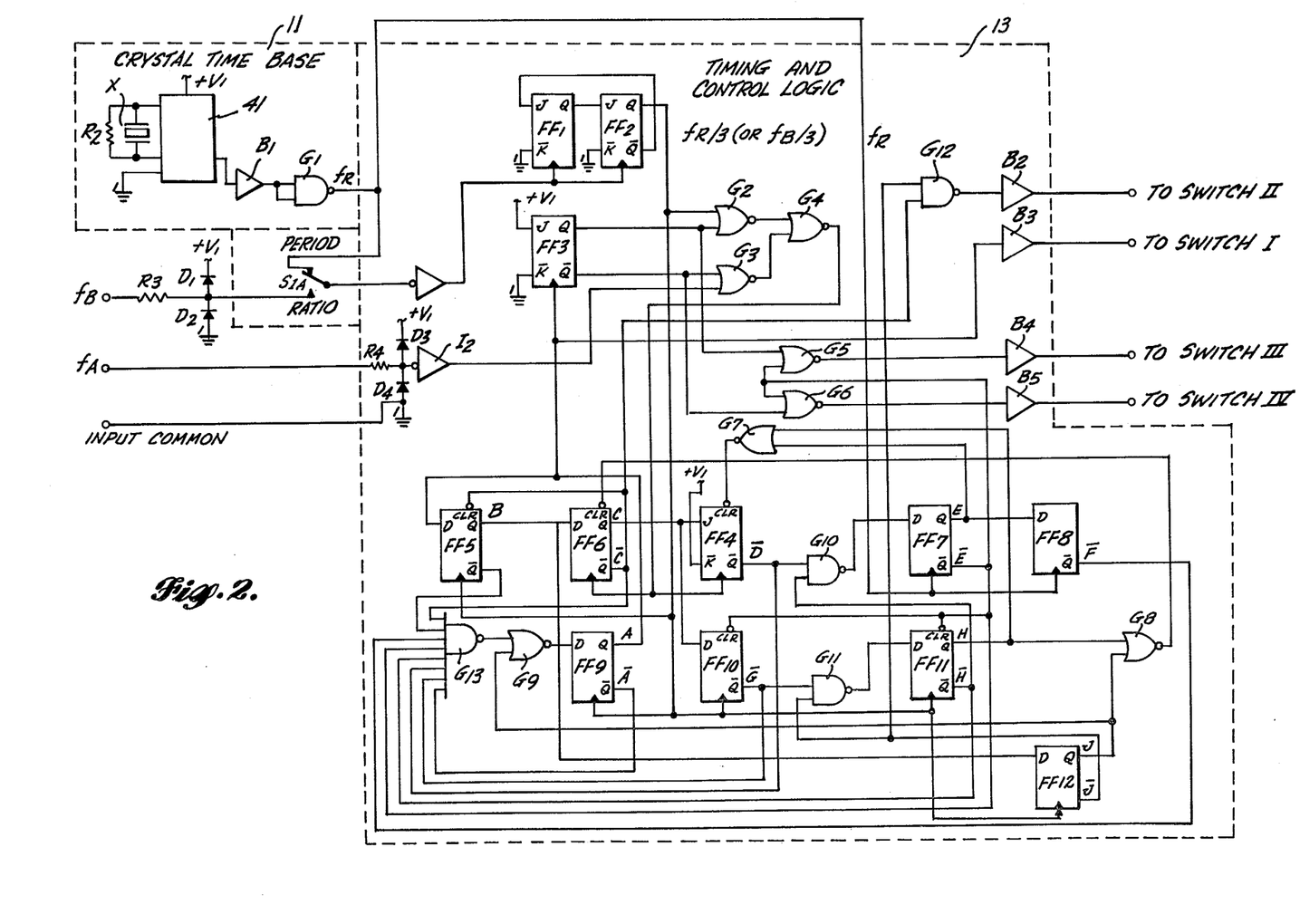
FIG. 2 is a partially schematic and partially logic diagram of a crystal time base and timing and control logic suitable for use in the embodiment of the invention illustrated in FIG. 1.
Figure 3:
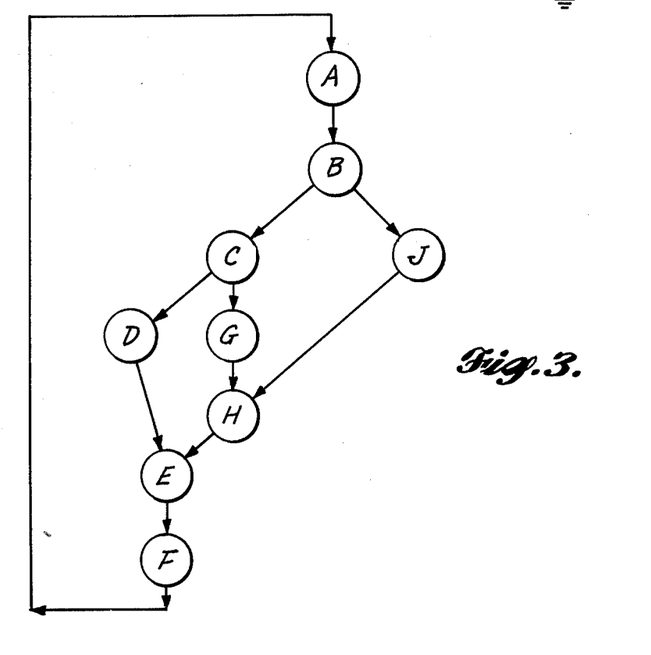
FIG. 3 is a state diagram illustrating the operation of the timing and control logic illustrated in FIG. 2.

In FIGS. 2 and 3, which illustrate in more detail the preferred embodiment of the invention illustrated in FIG. 1, FIG. 2 includes the crystal time base 11 and the timing and logic control 13 and FIG. 3 includes the other subsystems illustrated in FIG. 1.

The crystal time base 11 illustrated in FIG. 2 comprises: a crystal oscillator 41 (preferably, a CMOS integrated circuit); a crystal designated X; a resistor designated R2; a CMOS buffer amplifier (to obtain TTL compatability) designated B1; and, a two-input TTL NAND gate designated G1, capable of driving several TTL inputs. X and R2 are connected in parallel across the crystal inputs of the crystal oscillator 41. The crystal oscillator 41 is connected between a suitable voltage source designated +V1 and logic ground. An output of the crystal oscillator, which may be a 75 Hz output, is applied through B1 to both inputs of G1. G1 functions as a buffer (the inversion is inconsequential). The output of G1 is the $f_R$ (reference frequency) signal illustrated in FIG. 1 and previously described. Since the frequency of the G1 output is the same as the output of the crystal oscillator, if the output of the crystal oscillator is 75 Hz, $f_R$ equals 75 Hz, which has a period of 13.3 ms.

As illustrated in FIG. 1, $f_R$ is applied to one of the remote terminals, denoted the PERIOD terminal, of a switch, denoted S1A in FIG. 2. The $f_B$, unknown signal terminal is connected through a resistor designated R3 to the other remote terminal of S1A, denoted the RATIO terminal. The RATIO terminal is also connected to the junction between a pair of reverse biased diodes designated D1 and D2 connected between +V1 and logic ground. R3, D1 and D2 form a protection circuit that protects downstream items from the accidental application of high voltage.

The timing and control logic 13 illustrated in FIG. 2 comprises: two inverters designated I1 and I2; four J/$\overline{K}$ flip-flops designated FF1, FF2, FF3 and FF4; eight D flip-flops designated FF5, FF6, FF7, FF8, FF9, FF10, FF11 and FF12; eight two-input NOR gates designated G2-G9; three two-input NAND gates designated G10, G11 and G12; an eight-input NAND gate designated G13; and, four buffer amplifiers designated B2, B3, B4 and B5. In FIG. 2 and the following description of the connection between the various elements of the timing and control logic, only the functioning inputs and outputs of the flip-flops are illustrated and described. Nonfunctioning control inputs (e.g., preset, reset and clear) are connected to suitable biasing sources, or ground, as necessary; and nonfunctioning outputs are unconnected.

The common terminal of S1A is connected through I1 to the clock inputs of FF1 and FF2. The $\overline{K}$ inputs of FF1 and FF2 are connected to logic ground; the Q output of FF1 is connected to the J input of FF2 and the $\overline{Q}$ output of FF2 is connected to the J input of FF1. (Thus, FF1 and FF2 form a divide-by-three circuit.) The Q output of FF2 is connected to one input of G2 and to the clock inputs of FF5, FF9, FF10, FF11 and FF12.

The $\overline{K}$ input of FF3 is connected to logic ground and the J input of FF3 is connected to +V1. The Q output of FF3 is connected to the second input of G2 and to one input of G5. The $\overline{Q}$ output of FF3 is connected to one input of G3 and to one input of G6.

The $f_A$ unknown signal terminal is connected through a resistor designated R4 to the input of I2. The input of I2 is also connected to the junction between a pair of reverse biased diodes denoted D3 and D4, connected between +V1 and logic ground, again for input protection purposes. (The common input terminal is also connected to logic ground.) The output of I2 is connected to the second input of G3. The outputs of G2 and G3 are connected to the inputs G4 and the output of G4 is connected to the clock inputs of FF4 and FF6.

The Q output of FF5 is connected to the D input of FF6 and to the D input of FF12. The $\overline{Q}$ output of FF5 is connected to one input of G13. The Q output of FF6 is connected to the J input of FF4 and the D input of FF10. The $\overline{Q}$ output of FF6 is connected to one input of G13, the clear input of FF5 and one input of G12. The $\overline{K}$ input of FF4 is connected to +V1. The $\overline{Q}$ output of FF4 is connected to one input of G13 and one input of G10. The output of G10 is connected to the D input of FF7. The $\overline{Q}$ output of FF7 is connected to the D input of FF8 and to one input of G7. The Q output of FF7 is connected to the second inputs of G5 and G6, the clear inputs of FF10 and FF11 and one input of G13. The $\overline{Q}$ output of FF8 is connected to one input of G13.

The output of G13 is connected to one input of G9 and the output of G9 is connected to the D input of FF9. The Q output of FF9 is connected to the D input of FF5 and the clock input of FF3. The $\overline{Q}$ output of FF9 is connected to one input of G13. The $\overline{Q}$ output of FF10 is connected to one input of G13 and to one input of G11. The output of G11 is connected to the D input of FF11. The Q output of FF11 is connected to one input of G8 and to the second input of G7. The output of G7 is connected to the clear input of FF4. The $\overline{Q}$ output of FF11 is connected to the second input of G10 and to input of G13. The Q output of FF12 is connected to the second input of G8 and to the second input of G9. The output of G8 is connected to the clear input of FF6. The $\overline{Q}$ output of FF12 is connected to the second input of G11 and the second input of G12. Finally, $f_R$, the output of the crystal time base 11, is connected to the clock inputs of FF7 and FF8.

Figure 6:
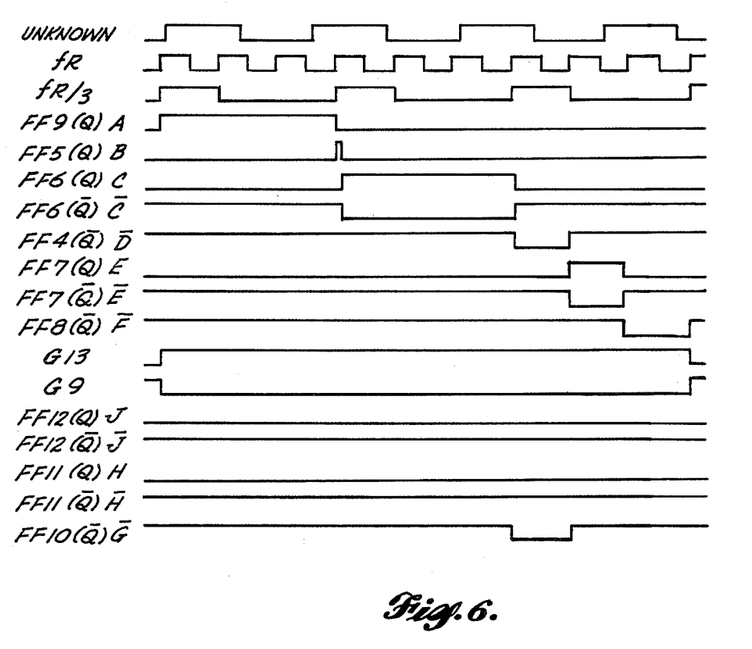
FIG. 6 is a timing diagram illustrating the operation of the timing and control logic illustrated in FIG. 2 during the calibration portion of a period conversion sequence of operation.
Figure 7:
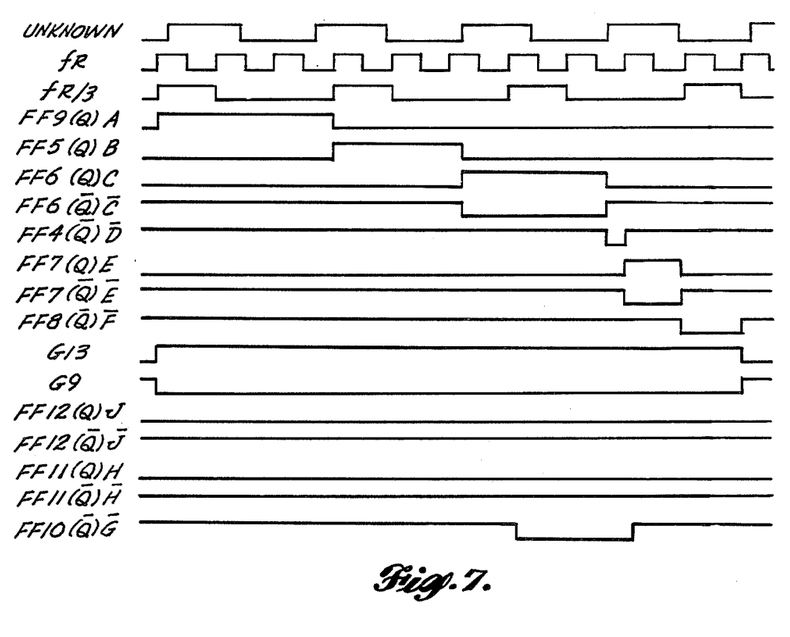
FIG. 7 is a timing diagram illustrating the operation of the timing and control logic illustrated in FIG. 2 during the measurement portion of a period conversion sequence of operation where the period of the unknown lies within the measurable period range.
Figure 8:
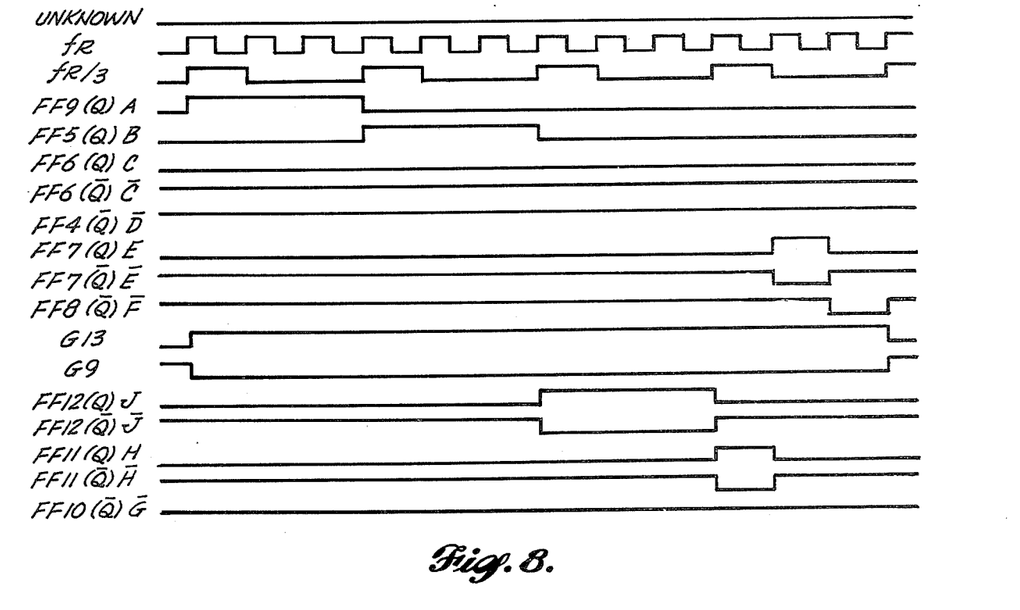
FIG. 8 is a timing diagram illustrating the operation of the timing and control logic illustrated in FIG. 2 during the measurement portion of a period conversion sequence where the period of the unknown is infinite, i.e., the unknown is a DC signal (or nonexistent); and, FIG. 9 is a timing diagram illustrating the operation of the timing and control logic illustrated in FIG. 2 during the measurement portion of a period conversion sequence where the period of the unknown, while not infinite, lies outside of the measurable period range.
Figure 9:
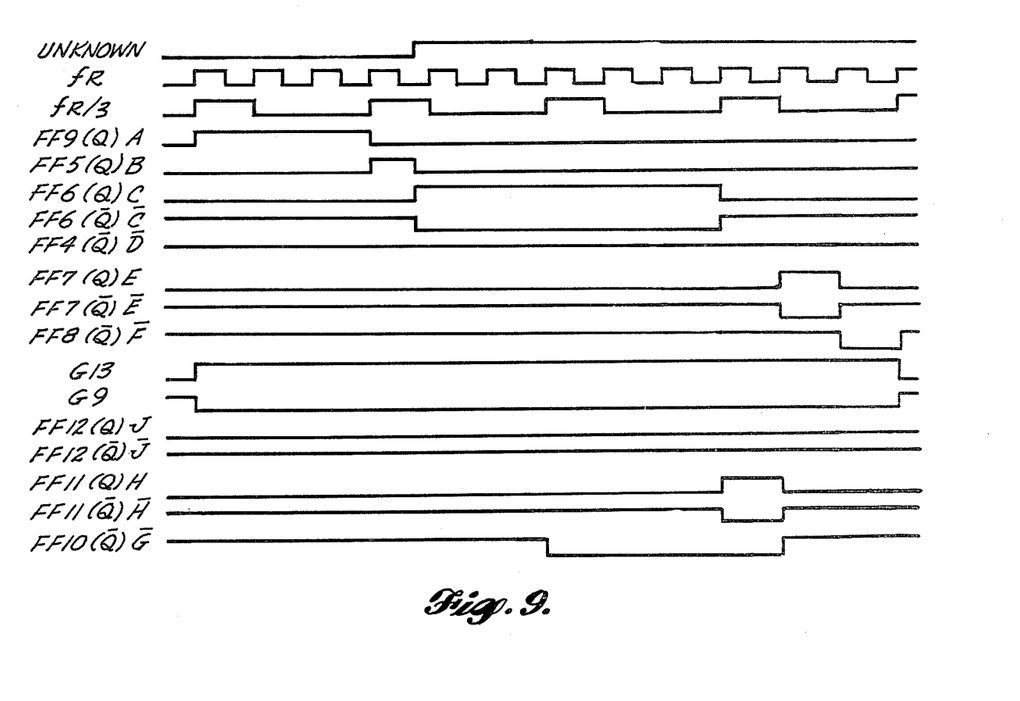

Turning now to a description of the operation of the timing and logic control illustrated in FIG. 2. In this regard, attention is directed to the state diagram illustrated in FIG. 3; and, the timing diagrams illustrated in FIGS. 6–9. For purposes of illustration only, the unknown frequency signal, $f_A$, is illustrated in FIGS. 6, 7 and 9 as a squared wave having a 50% duty cycle. However, the unknown frequency signal can take on any form falling within the period limit hereinafter described, since only the leading edge of each unknown frequency signal is recognized. (In fact, in an actual embodiment of the invention, preferably, the $f_A$ and $f_B$ inputs are actually Schmitt trigger outputs to allow non-ideal signals to be converted.)

The timing and control logic is a control circuit that is alternately controlled by either the period of the signal passed by S1A ($f_R$ or $f_B$) or by the period of the signal received at the $f_A$ unknown frequency terminal. Which of the signals is actually in control at any point in time is determined by the state of FF3. More specifically, FF3 is a toggle flip-flop. As a result, each time it receives a clock pulse, FF3 changes state. (As will be better understood from the following description, FF3 is triggered at the beginning of each calibration or measurement cycle of operation.) Since the Q and $\overline{Q}$ outputs of FF3 are connected to G2 and G3, G2 and G3 are alternately enabled. The output of the enabled gate passes through G4 and clocks FF4 and FF6. Thus, G2, G3 and G4 form a multiplexer that controls which signals clock FF4 and FF6. The actual FF4 and FF6 clock signal is either $f_A$, or $f_R/3$ or $f_B/3$, since $f_R$ and $f_B$ are divided by the divide-by-3 circuit formed by FF1 and FF2, as noted above, prior to being applied to G2. Thus, if it is assumed that the output of G1 ($f_R$) is a 75 Hz signal having a period of 13.3 ms, the Q output of FF2 is a 25 Hz signal having a period of 40 ms. Similarly, the frequency of $f_B$ signals are divided by three. In addition to controlling the G2/G3/G4 multiplexer, the outputs of FF3 control which one of the G5 and G6 gates are enabled. Since one of those gates is connected to the Q output of FF3 and the other is connected to the other output of FF3 they are alternately enabled. Specifically, G5 is enabled when G2 is enabled and G6 is enabled when G3 is enabled.

FIG. 6 is a timing diagram illustrating the operation of the timing and control logic during the calibration cycle of the period measurement mode of operation. In this case, S1A applies $f_R$ to the timing and control logic, as discussed above. In order for the G2/G3/G4 multiplexer to pass the output of the divide-by-3 circuit formed by FF1 and FF2 (rather than $f_A$), at the beginning of the calibration cycle FF3 must be reset i.e., its Q output must be shifted low. This action occurs when FF9 is clocked, as discussed below. (While, for purposes of diagrammatic completion, an $f_A$ unknown frequency signal is shown in the top line of FIG. 6, this signal has no effect on the operation of the timing and control logic during a calibration cycle of operation, since G3 is disabled.)

The calibration cycle of operation starts when the Q output of FF2 shifts high. This action clocks FF9. At this time, a high is on the D input of FF9, whereby the Q output of FF9 goes high, as shown on the fourth line of FIG. 6. (The D input of FF9 was high because all of the inputs to G13 were high and because the Q output of FF12 is high. This condition is present when the timing and control logic 13 is not in any of the other states and is noted in the state diagram (FIG. 3) as the A state. That is, the A state occurs when FF9 is set.) When FF9 is set, in addition to clocking FF3, a high is placed on the input of B3. Clocking FF3 places it in a reset state whereby G2 and G5 are enabled. Further, the high output of B3, which is connected to switch I, causes switch I to close. As a result, C1 is discharged by being shorted.

When the first following $f_R$ pulse occurs, the Q output of FF2 drops low. This action has no effect. When the third $f_R$ pulse occurs, the Q output of FF2 again shifts high. This action clocks FF5 causing the high Q output of FF9 to be shifted into FF5, whereby the Q output of FF5 shifts high. At the same time, as FF9 is clocked by the low high shift on the output of FF2, the Q output of FF9 returns low because the output of G9 is now low. As a result, the input (and thus the output) of B3 shifts low. Consequently, switch I is opened and C1 is no longer shorted. The closure time of switch I must be adequate to completely discharge C1.

Shortly after the output of FF2 shifts high, the output of G4 shifts high. (The time delay is created by gates G2 and G4.) When the output of G4 shifts high, FF6 is clocked. Since the D input of FF6, at this time, is high, FF6 is set, i.e., its Q output goes high and its $\overline{Q}$ output goes low. Shifting of the $\overline{Q}$ output of FF6 low clears FF5. The timing and control logic has now entered state C. (State B was entered for a short period of time when the Q output of FF5 shifted high.)

When the $\overline{Q}$ output of FF6 shifts low, in addition to clearing FF5, the output of G12 is forced high because, at this point in time, the $\overline{Q}$ output of FF12 is high. Consequently, the output of B2 goes high. As will be better understood from the following description of FIG. 4, the output of B2 is connected to switch II. Consequently, the current source is connected to C1 when the output of B2 shifts high.

The timing and control logic remains in this state (C) until, after shifting low, the Q output of FF2 again shifts high. When this occurs, after a short time delay (created by G2 and G4), FF6 and FF4 are again clocked. Since the input of FF6 is now low, FF6 is reset. Prior thereto, FF4 reads the output of FF6 (which is high) whereby FF4 is set. Thus, the $\overline{Q}$ output of FF4, which is the only output of FF4 that is used, shifts low, as illustrated on the eighth line of FIG. 6. Thus, state D is entered. (When FF6 is reset, its $\overline{Q}$ output returns high. Since the inputs of G12 are now both high, the output of G12 shifts low, whereby switch II is opened and charging of C1 ends.)

When FF4 was set, the output of G10 shifted high. Consequently, upon the occurrence of the next $f_R$ pulse, FF7 is set. At this time, FF11 is clear, (i.e., its Q output is low). When FF7 is set, its Q output goes high, as a result, the FF7 input of G7 shifts high, whereby the output of G7 shifts low and resets FF4. In addition, when FF7 is set, its $\overline{Q}$ output shifts low, whereby the output of G5 shifts high. This output is buffered by B4 and causes switch III to close, whereby the charge on C1 is applied to the feedback sample and hold circuit to update that circuit, as previously described.

The next $f_R$ pulse clocks FF8, which reads the Q output of FF7. At substantially the same time, FF7 is cleared because the $f_R$ pulse causes FF7 to read the output of G10, which is now low. The next $f_R$ pulse again clocks FF8 which is now cleared because the Q output of FF7 is now low. When FF8 is cleared, its Q output shifts high, whereby all of the inputs to G13 are again high, causing a high to be present at the D input of FF9. At this point, the cycle is ready to repeat. However, as discussed above, rather than a calibration cycle occurring, a measurement cycle occurs. (It is pointed out that while, as illustrated in FIG. 6, FF10 may be set and reset during the calibration cycle, this operation has no effect because FF10 is reset well before FF11 is clocked to read the output of FF10.)

Turning now to the measurement cycle when, the Q output of FF2 shifts from low to high following the resetting of FF8, FF9 is again clocked whereby its Q output shifts from low to high, as shown on the fourth line of FIG. 7. This action causes state A to be entered and FF3 to be clocked. When FF3 is clocked, it is placed in a set state, whereby its $\overline{Q}$ output is low. As a result, G3 is enabled and the G2/G3/G4 muliplexer passes $f_A$ signals, rather than $f_R/3$ signals. Further, G6 rather than G5 is enabled. Because the multiplexer passes $f_A$ signals, FF6 and FF4 are clocked by the leading edge of the next $f_A$ cycle, after entering state B, rather than the leading edge of an $f_R/3$ cycle. Other than this difference, and assuming the $f_A$ signal has a period lying within the measurable period, the operation of the timing and control logic is generally the same for the measurement cycle as it was for the calibration cycle. More specifically, when state A is entered, switch I is closed and C1 is discharged during a single $f_R/3$ cycle. At the start of the next $f_R/3$ period, when a Q output of FF2 shifts high, the B state is entered. The timing and control logic remains in the B state until the leading edge of the next following complete $f_A$ cycle occurs, as shown on line 5 of FIG. 7. When the leading edge of the next $f_A$ cycle occurs, after a short time delay created by G3 and G4, FF6 and FF4 are clocked. FF6 reads the Q output of FF5 (which is high) and the C state is entered. In the C state, C1 is charged for a complete cycle of $f_A$ because of the $\overline{Q}$ output of FF6 is low for this period of time, whereby switch II is closed via G12 and B2. When the leading edge of the next following $f_A$ cycle occurs, FF6 and FF4 are again clocked. FF6 returns to its reset state because the Q output of FF5 is low, whereby switch II is opened. At approximately the same time, FF4 is set whereby the D state is entered. The next $f_R$ pulse sets FF7 (E state entered) whereby the output of G6 goes high and switch IV (which is connected to the output of B5) is closed. FF4 is also reset at this time. When switch IV is closed, as previously described, the charge on C3 is updated in accordance with the charge on C1. The occurrence of the next $f_R$ pulse ends the E state and causes the F state to be entered, i.e., FF7 is reset and FF8 is set. The immediately following $f_R$ pulse ends the cycle of operation by resetting FF8. Again, if FF10 is set during this cycle of operation, it has no effect since it is reset (by FF7 being set) before it's Q output can be read by FF11.

As will be appreciated by those skilled in the art from reading the foregoing description, the period range that is measurable by the invention in the period mode of operation is limited by $f_R/3$. That is, the period of $f_A$ must be less than the period of $f_R/3$. As a result, if the period of the unknown frequency signal $f_A$ is infinite or longer than $f_A$ different measuring cycles occur. The measuring cycle that occurs if the period of $f_A$ is infinite (or extremely long) is illustrated in FIG. 8. The infinite period unknown frequency signal ($f_A$) is illustrated on the top line of FIG. 8 as a constant low input. As with the normal measuring cycle during the first $f_R/3$ period, state A is entered, switch I is closed and C1 is discharged. At the end of the first $f_R/3$ period, the timing and control logic shifts from state A to state B. Since no $f_A$ leading edge occurs, FF6 and FF4 are not clocked, whereby state C cannot be entered. Rather, the timing and control logic remains in state B for an $f_R/3$ period. At the leading edge of the next $f_R/3$ cycle period, FF12 is set and the timing and control logic shifts to state J. More specifically, as shown in the center of FIG. 8, on the lines showing the Q and $\overline{Q}$ outputs of FF12, at the end of the second $f_R/3$ period, FF12 is set because it is clocked and the Q output of FF5 is high. At the same time, FF5 is clocked to read the now low output of FF9, whereby FF5 is reset. When state J is entered, the output of G12 shifts high, whereby switch II is closed and C1 is charged. The timing and control logic remains in state J until the leading edge of the next $f_R/3$ cycle occurs. When this edge occurs, FF12 is reset because the output of FF5 is now low. As a result, the output of G12 shifts low and the charging of C1 ends. Hence, C1 is charged for a complete $f_R/3$ cycle.

Prior to FF12 being reset, the high on the output of G11 is read by FF11, whereby FF11 is set. Setting of FF11 causes FF6 and FF4 to be cleared, if for some reason they were previously set. In addition, the high on the $\overline{Q}$ output of FF11 causes the output of G10 to be high, whereby FF7 is set by the next $f_R$ pulse. As a result, the output of G6 goes high and switch IV is closed. Closure of switch IV causes the charge on C1 to update the charge on C3. Since C1 was charged for the maximum period of time ($f_R/3$), of course, the charge on C3 will create a maximum scale reading, which indicates that the period of FF5 (infinity) is greater than the measurable period.

If the period of $f_A$ is not infinity, but is greater than the period of $f_R/3$, the timing and control diagram functions in accordance with the timing diagram illustrated in FIG. 9. As with the normal cycle of operation, for the first $f_R/3$ cycle, switch I is closed and C1 is discharged. At the leading edge of the next $f_R/3$ cycle, the timing and control logic shifts from state A to state B. If the leading edge of an $f_A$ signal occurs before the leading edge of the next $f_R/3$ cycle, state C is entered because FF6 is clocked by the output of G4 shifting from low to high. This is shown on line 6 of FIG. 9. (If the $f_A$ leading edge does not occur before the $f_R/3$ leading edge, state J is entered, as discussed in the preceeding paragraph.) At the same time, state B terminates because the $\overline{Q}$ output of FF6 shifts low.

Upon the occurrence of the leading edge of the next $f_R/3$ cycle, state G is entered as illustrated on the bottom line of FIG. 9. More specifically, the leading edge of the next $f_R/3$ signal clocks FF10, whereby FF10 reads the high Q output of FF6. As a result, FF10 is set. Consequently, the $\overline{Q}$ output of FF10 shifts from high to low. At this point, the timing and control is in both state G and state C. (Since the timing and control logic is in state C, C1 is charging.) The timing and control logic remains in states C/G until the leading edge of the next following $f_R/3$ cycle occurs. At this point, the apparatus shifts to state H. More specifically, the leading edge of the next $f_R/3$ signal causes FF11 to read the output of G11, which is now high. As a result, FF11 is set. When FF11 is set, the output of G8 clears FF6; and, the output of G12 shifts low, whereby, the charging of C1 ends. If FF4 was set for some reasons or other (for example, because an $f_A$ leading edge occurred coincidentally with the $f_R/3$ leading edge that set FF11), FF4 is also cleared (via G7) when FF11 is set, i.e., when state H is entered.

The next $f_R$ pulse occurring after state H is entered, clocks FF7. Since, at this time the output of G10 is high, FF7 is set and state E is entered, as a result, the charge on C1 is used to update the charge on C3. When FF7 is set, its $\overline{Q}$ output shifts low, whereby FF10 and FF11 are cleared. Consequently, state H and G are terminated. The immediately following $f_R$ pulse shifts the timing and control logic from state E to state F; and the next $f_R$ pulse terminates state F, as previously described. As with the situation that occurs when the period of $f_A$ is extremely large or infinite, when the period of $f_A$ is slightly greater than the measurable period, a maximum (or greater than maximum) charge is created on C1. Thus, a maximum (or a greater than maximum) charge is transferred to C3 to cause a maximum scale reading.

It will be appreciated from the foregoing discussion that G13 and G9 are utilized and form a start circuit that allows the A state to be entered when the timing and control logic is first energized, if it is not in any other defined state. If the timing and control logic is in some other state, it cycles until the A state can be entered.

The only difference between the ratio determining mode of operation and the period determining mode of operation is that $f_B/3$ replaces $f_R/3$. As a result, the foregoing discussion will not be repeated, i.e., the sequence of operation of the timing and control logic for the ratio determining mode of operation will not be set forth. It should be noted, however, that the period of $f_A$ must be less than the period of $f_B/3$ in order for a usable ratio signal to be developed. It also is pointed out that the use of a $f_B/3$ control signal for the ratio mode of operation does not change the mathematical description of this mode, since the factor 3 is merely a scale factor, which is divided out by a resistive divider located on the output of the output sample and hold circuit as illustrated in FIG. 3 and hereinafter described. This artifice enables the ratio mode to work for ratios greater than one (1), as well as less than one (1).

Turning now to a description of the current source 15, is illustrated as comprising generator 19, feedback sample and hold circuit 21, voltage reference 23, and output sample and hold circuit 25, which are illustrated in FIG. 3 in somewhat more detail than illustrated in FIG. 1. The current source 15 is illustrated as comprising two PNP transistors designated Q1 and Q2; an NPN transistor designated Q3; a zener diode designated ZD1; four resistors designated R5, R6, R7 and R8; two diodes designated D5 and D6; and an N-channel field effect transistor designated FET. (Actually, ZD1, R8, D5, D6 and FET are not part of the current source. Rather they form voltage limiting clamps that prevent latch-up during turn-on and operation). The emitters of Q1 and Q2 are connected through R5 and R6, respectively, to a voltage source designated +V2. The bases of Q1 and Q2 are connected together and to the collectors of Q2 and Q3. The emitter of Q3 is connected through R7 to analog ground (which is connected to logic ground at the power supply). The anode of ZD1 is connected to analog ground and the cathode of ZD1 is connected to the base of Q3. The anode of D5 is connected to +V1 and the cathode of D5 is connected to the anode of D6. The cathode of D6 is connected through R8 to analog ground. The junction between D6 and R8 is connected to the drain and source terminals of FET and the gate terminal of FET is connected to the collector of Q1.

The ramp generator 19 includes the same components illustrated in FIG. 1, except that the unity amplifier 27 is shown in slightly more detail as an operational amplifier. More specifically, the output of the current source, i.e., the collector of Q1, is connected through switch II to the noninverting input of the operational amplifier 27. Switch I is connected between the noninverting input of the operational amplifier and analog ground. C1 is also connected between the noninverting input of the operational amplifier and analog ground. Finally, the output of the operational amplifier is connected to its inverting input.

The feedback sample and hold circuit 21 includes R1, C2 and the error operational amplifier 29. In addition, the more detailed sample and hold circuit illustrated in FIG. 3 includes an NPN transistor designated Q4 and a further resistor designated R9. As with FIG. 1, the output of the operational amplifier 27 of the ramp generator 19 is connected through switch III and R1 in series to the inverting input of the operational amplifier 29 of the feedback sample and hold circuit 21. The output of the operational amplifier 29 of the feedback sample and hold circuit 21 is connected to the base of Q3 of the current source (which constitutes the control input of the current source). In addition, the output of the operational amplifier 29 is connected to the collector and base of Q4. The emitter of Q4 is connected through C2 to the inverting input of the operational amplifier 29 and through R9 to analog ground. (The base-emitter junction of Q4 provides temperature compensation for Q3.)

The voltage reference 23 comprises: a temperature compensated zener diode designated ZD2; four resistors designated R10, R11, R12 and R13; and a potentiometer designated P1. The anode of ZD2 is connected to analog ground. The cathode of ZD' is connected through R10 to +V2. The junction between R10 and ZD2 is connected through R11 in series with R12, P1, and R13 in that order to analog ground. The adjustable element of P1 is connected to the noninverting input of the operational amplifier 29 of the feedback sample and hold circuit 21.

The output sample and hold circuit 25 includes the same elements illustrated in FIG. 1, i.e., a unit amplifier 31 and C3. However, the amplifier is shown in more detail as an operational amplifier. As in FIG. 1, the output of the operational amplifier 27 of the ramp generator 19 is connected through switch IV to the operational amplifier 31, in particular, the noninverting input of the operational amplifier 31. The noninverting input of the operational amplifier is also connected through C3 to analog ground. The output of the operational amplifier is connected to the inverting input of the operational amplifier.

In addition to the foregoing circuits, FIG. 3 also illustrates an output adjustment circuit comprising: four resistors designated R14, R15, R16 and R17; two potentiometers designated P2 and P3; and a single pole, double throw switch designated S1B. The two remote terminals of S1B are denoted PERIOD and RATIO; and, S1B is ganged with S1A. P2 is connected between +V2 and −V2. R14 is connected between the movable element of P2 and the LOW output terminal. The LOW output terminal is also connected through R15 to analog ground. R16 is connected in series with P3 and R17, in that order, between the output of the operational amplifier 31 of the output sample and hold circuit 25 and the LOW output terminal. The output of the operational amplifier 31 of the sample and hold circuit is also connected to the PERIOD terminal of S1B. The movable element of P3 is connected to the RATIO terminal of S1B. The common terminal of S1B is connected to the HIGH output terminal.

Since the circuits illustrated in FIG. 3 are conventional and since their general manner of operation has been described above with respect to FIG. 1, the operation of these circuits will not be described here in detail, except to discuss the operation of some of the additional elements illustrated. In this regard, P1 controls, of course, the voltage at the inverting input of the operational amplifier 29 of the feedback sample and hold circuit 21. Thus, P1 controls the level of the feedback or error voltage applied to the current source 15. The value of R11 and R12 provide a course adjustment of the reference voltage. P2 controls the voltage on the LOW output terminal and, thus, assists in zeroing the converter. P3 allows the converter to be calibrated when used in the ratio mode of operation.

It will be appreciated from the foregoing description that the invention comprises a period or ratio (period)-to-voltage converter. In its period mode of operation, the invention alternates between calibration and measurement cycles. At the beginning of each cycle a capacitor, which is charged during each cycle, is discharged. Near the end of the calibration cycle a feedback sample and hold circuit has its stored value updated. The output of feedback sample and hold circuit controls the current level applied to the capacitor that is charged during both the calibration and measurement cycles. Near the end of the measurement cycle an output sample and hold circuit is updated. In the ratio mode of operation, one unknown frequency signal controls charging during the "calibration" cycle and the other unknown controls charging during the "measurement" cycle. That is, both modes of operation are the same except that calibration cycle charging is controlled by a known reference frequency in the period mode and by an unknown frequency in the ratio mode. Since the calibration cycles alternate with the measurement cycles, the effects of temperature, element deterioration and the like on the common components are substantially reduced if not entirely eliminated. In fact, it has been found that an accuracy of ±0.05% or better can be achieved using the invention.

While a preferred embodiment of the invention has been illustrated and described, it will be appreciated that various changes can be made therein without departing from the spirit and scope of the invention. Hence, the invention can be practiced otherwise than as specifically described herein.

The embodiments of the invention in which as exclusive property or privilege is claimed as defined as follows:

1. A converter for converting signal period information into analog voltage form comprising:
 a ramp generator including a capacitor and a switch means, said switch means connected to said capacitor for controlling the charging and discharging of said capacitor;
 a current source connected to said ramp generator for supplying current to said ramp generator for charging said capacitor of said ramp generator;
 feedback means connected to said current source for controlling the magnitude of current produced by said current source;
 a feedback switch means connected between the output of said ramp generator and said feedback means;
 output means for storing information in analog voltage form;
 output switch means connected between the output of said ramp generator and said output means; and,
 control means for receiving signals whose period information is to be converted into analog voltage form and, in accordance therewith, controlling: (a) said switch means of said ramp generator such that said capacitor of said ramp generator is alternately charged and discharged in a cyclical manner; and, (b) said feedback switch means and said output switch means such that at the end of each charging cycle of said capacitor of said ramp generator the output of said ramp generator is alternately applied to said feedback means and to said output means.

2. A converter as claimed in claim 1 wherein said control means includes:
 timing and control logic connected to receive a first signal of unknown frequency; and,
 a crystal time base adapted to generate a signal of known frequency, said crystal time base being connected to said timing and control logic.

3. A converter as claimed in claim 2 wherein said switch means of said ramp generator comprises first and second switches, said first switch connected across said capacitor of said ramp generator so as to short said capacitor when said first switch is closed, said second switch connected between said current source and said capacitor of said ramp generator such that said capacitor is charge by the current produced by said current source when said second switch is closed, said first and second switches being connected to said timing and control logic so as to be opened and closed by said timing and control logic.

4. A converter as claimed in claim 3 wherein said feedback means comprises a feedback sample and hold circuit and wherein said feedback switch means comprises a third switch connected between the output of said ramp generator and the input of said feedback sample and hold circuit, said feedback sample and hold circuit including a capacitor connected such that the charge on said capacitor of said feedback sample and hold circuit is updated by the charge on said capacitor of said ramp generator when said third switch is closed, said third switch being connected to said timing and control logic so as to be opened and closed by said timing and control logic.

5. A converter as claimed in claim 4 wherein said output circuit comprises an output sample and hold circuit and wherein said output switch means comprises a fourth switch, said output sample and hold circuit including a capacitor connected such that the charge on said capacitor of said output sample and hold circuit is updated by the charge on said capacitor of said ramp generator when said fourth switch is closed, said charge on said capacitor of said output sample and hold circuit forming said information stored in analog voltage form by said output means, said fourth switch being connected to said timing and control logic so as to be opened and closed by said timing and control logic.

6. A converter as claimed in claim 5 wherein said control means also includes a switch having a common terminal and remote terminals, one of said remote terminals connected to receive a second signal of unknown frequency and another of said remote terminals connected to the output of said crystal time base, said common terminal being connected to said timing and control logic.

7. A converter as claimed in claim 6 wherein said timing and control logic is alternately controlled by the signal on the common terminal of said switch of said control means and said first signal of unknown frequency.

8. A converter as claimed in claim 7 wherein said timing and control logic controls said first, second and third switches when said timing and control logic is controlled by the signal on the common terminal of said switch of said control means such that: (a) first said first switch is closed for a period of time determined by the period of the signal on the common terminal of said switch of said control means; (b) then said second switch is closed for a period of time determined by the period of the signal on said common terminal of said switch of said control means; and, (c) finally, said third switch is closed for a period of time determined by the period of the output of said crystal time base.

9. A converter as claimed in claim 8 wherein said timing and control logic controls said first, second and fourth switches when said timing and control logic is controlled by said first signal of unknown frequency such that: (a) first said first switch is closed for a period of time determined by the period of the signal on the common terminal of said switch of said control means; (b) then, said second switch is closed for a period of time determined by the period of said first signal of unknown frequency; and, (c) finally, said fourth switch is closed for a period of time determined by the period of the output of said crystal time base.

10. A converter as claimed in claim 9 wherein said timing and control logic controls said first, second and fourth switches when said timing and control logic is controlled by said first signal of unknown frequency, such that a maximum output occurs if the period of said first signal of unknown frequency is greater than the period of said signal on said common terminal of said switch of said control means by a predetermined amount.

11. A converter as claimed in claim 2 wherein said control means also includes a switch having a common terminal and remote terminals, one of said remote terminals connected to receive a second signal of unknown frequency and another of said remote terminals is connected to the output of said crystal time base, said common terminal being connected to said timing and control logic.

12. A converter as claimed in claim 11 wherein said timing and control logic is alternately controlled by the signal on the common terminal of said switch of said control means and said first signal of unknown frequency.

13. A converter as claimed in claim 12 wherein said timing and control logic controls said switch means of said ramp generator and said feedback switch means when said timing and control logic is controlled by the signal on the common terminal of said switch of said control means such that: (a) first said capacitor of said ramp generator is shorted for a period of time determined by the period of the signal on the common terminal of said switch of said control means; (b) then, said capacitor of said ramp generator is charged for a period of time determined by the period of the signal on said common terminal of said switch of said control means and (c) finally, said feedback switch means is closed for a period of time determined by the period of the output of said crystal time base.

14. A converter as claimed in claim 13 wherein said timing and control logic controls said switch means of said ramp generator and said output switch means when said timing and control logic is controlled by said first signal of unknown frequency such that: (a) said first capacitor of said ramp generator is shorted for a period of time determined by the period of the signal on the common terminal of said switch of said control means; (b) said capacitor on said ramp generator is charged for a period of time determined by the period of said first signal of unknown frequency; and, (c) finally, said output switch means is closed for a period of time determined by the period of the output of said crystal time base.

15. A converter as claimed in claim 1 wherein said switch means of said ramp generator comprises first and second switches, said first switch connected across said capacitor of said ramp generator so as to short said capacitor when said first switch is closed, said second switch connected between said current source and said capacitor of said ramp generator such that said capacitor is charged by the current produced by said current source when said second switch is closed, said first and second switches being connected to said control means so as to be alternately opened and closed by said control means.

16. A converter as claimed in claim 1 wherein said feedback means comprises a feedback sample and hold circuit and wherein said feedback switch means comprises a switch connected between the output of said ramp generator and the input of said feedback sample and hold circuit, said feedback sample and hole circuit including a capacitor connected such that the charge on said capacitor of said feedback sample and hold circuit is updated by the charge on said capacitor of said ramp generator when said switch is closed, said switch being connected to said control means so as to be opened and closed by said control means.

17. A converter as claimed in claim 16 wherein said output circuit comprises an output sample and hold circuit and wherein said output switch means comprises a second switch, said output sample and hold circuit including a capacitor connected such that the charge on said capacitor of said output sample and hold circuit is updated by the charge on said capacitor of said ramp generator when said second switch is closed, said charge on said capacitor of said output sample and hold circuit forming said information stored in analog voltage form by said output means.

18. A converter as claimed in claim 1 wherein said output circuit comprises an output sample and hold circuit and wherein said output switch means comprises a switch, said output sample and hold circuit including a capacitor connected such that the charge on said capacitor of said output sample and hold circuit is updated by the charge on said capacitor of said ramp generator when said switch is closed, said charge on said capacitor of said output sample and hold circuit forming said information stored in analog voltage form by said output means, said switch being connected to said control means so as to be opened and closed by said control means.

* * * * *